(12) United States Patent
Degn

(10) Patent No.: US 7,496,825 B2
(45) Date of Patent: Feb. 24, 2009

(54) CRC-BASED ERROR CORRECTION

(75) Inventor: Niels Degn, Fredriksberg (DK)

(73) Assignee: Nokia Corporation, Espoo (FI)

( * ) Notice: Subject to any disclaimer, the term of this patent is extended or adjusted under 35 U.S.C. 154(b) by 199 days.

(21) Appl. No.: 10/515,809

(22) PCT Filed: May 24, 2002

(86) PCT No.: PCT/EP02/05720

§ 371 (c)(1), (2), (4) Date: Nov. 30, 2005

(87) PCT Pub. No.: WO03/100987

PCT Pub. Date: Dec. 4, 2003

(65) Prior Publication Data

US 2006/0123311 A1    Jun. 8, 2006

(51) Int. Cl.
*H03M 13/00* (2006.01)
(52) U.S. Cl. ...................... 714/785; 714/784
(58) Field of Classification Search .................. 714/785
See application file for complete search history.

(56) References Cited

U.S. PATENT DOCUMENTS

| | | | |
|---|---|---|---|
| 5,491,700 A * | 2/1996 | Wright et al. | 714/759 |
| 5,689,727 A | 11/1997 | Bonke et al. | 395/840 |
| 5,982,294 A | 11/1999 | Takayama et al. | 340/825.44 |
| 6,128,760 A * | 10/2000 | Poeppleman et al. | 714/757 |
| 2002/0046382 A1 | 4/2002 | Yang | 714/758 |
| 2006/0041826 A1* | 2/2006 | Bhattacharya et al. | 714/782 |

OTHER PUBLICATIONS

International Search Report for PCT/EP02/05720, dated Mar. 3, 2003.
International Preliminary Examination Report for PCT/EP02/05720, dated Jul. 12, 2004.

* cited by examiner

*Primary Examiner*—Esaw T Abraham
*Assistant Examiner*—Sam Rizk
(74) *Attorney, Agent, or Firm*—Perman & Green, LLP

(57) ABSTRACT

An ordered list of CRC syndromes, corresponding to single-bit errors, is used to identify an error bit position, enabling correction of the bit at the identified error bit position. For instance, the syndrome corresponding to an error at the fifth bit position is in the fifth position in the list. A syndrome for a received block is compared sequentially with the members of the list until a match is found. When a match is found, the corresponding bit of the received block is inverted.

18 Claims, 2 Drawing Sheets

CRC-BASED ERROR CORRECTION

This application is the National Stage of International Application No. PCT/EP02/05720, filed on May 24, 2002, which designated the United States of America, and which international application was published under PCT Article 21(2) as WO Publication No. WO 03/100987.

FIELD OF THE INVENTION

The present invention relates to the use of CRC (cyclic redundancy check) codes for error correction.

BACKGROUND TO THE INVENTION

In the GPRS (General Packet Radio Service) extension of the GSM (Global System for Mobile communication) mobile phone system, there are four different coding schemes (CS1-CS4), which are used for data transfer. Coding schemes CS1 to CS3 make use of convolution coding to provide an error correction capability. However, convolution coding is not used in the CS4 scheme. The CS4 scheme is therefore not tolerant of errors. However, the CS4 scheme does employ CRC codes for identifying the existence of errors.

When using CS4, GPRS blocks having one or more bit errors are rejected. Simulations have shown that when the BLER (Block Error Rate) for the CS4 coding scheme is about 10% approximately 40% of the rejected blocks contain only a single error.

Many error patterns, will yield the same syndrome. In the present document, the term "syndrome" means the remainder obtained by modulo-2 division of a received signal by the appropriate generator polynomial. The normal error correction algorithm, called the table lookup decoding algorithm, associates one error pattern with each syndrome. When the syndrome is calculated, the corresponding error pattern can be found in a look-up table and the errors can be corrected. There can be no certainty that the correct error pattern has been found because several error patterns results in the same syndrome. Accordingly, the normal decoding procedure has to be repeated. However, it is well known that table lookup decoding can only be used when there are less than 10 CRC bits because of memory and search time demands.

For CS4 encoding, there are 16 CRC bits and, therefore, table look-up decoding is impractical.

SUMMARY OF THE INVENTION

The present invention makes use of an list of CRC error codes for identifying single bit errors thereby enabling such errors to be corrected. In the context of GPRS, at least, an increase in performance of about 2-3 dB has been achieved.

Whilst the present invention was inspired by a problem with CS4 coding in GPRS, it will be appreciated that the invention itself is more generally applicable.

According to the present invention, there is provided an apparatus for error-correcting a digital signal including, a cyclic redundancy code, the apparatus comprising:
 a memory storing CRC syndromes, the syndromes corresponding to respective ones of each of the possible single-bit error conditions of a received signal;
 comparator means configured to sequentially compare a CRC syndrome for a received signal with syndromes in said memory;
 a counter configured to be incremented or decremented for each comparison by the comparator means until a match is found or the syndromes in the memory have been exhausted; and
 inverting means for inverting a bit of said received signal in dependence on the count value of said counter.

Preferably, the syndromes stored in the memory are arranged in a list ordered by the error bit positions to which they relate.

The counter may be initialised with a start address and the comparison means configured to address the memory using the value of the counter, in which case the inverting means is preferably configured to subtract said start address from the current counter value to determine the bit to be inverted.

Alternatively, the comparison means may be configured to address the memory using an address value generated by adding a start address value to the value of the counter, in which case the inverting means is preferably configured to invert the bit in the position corresponding to the value of said counter.

Preferably, means is included for calculating the syndrome of the block after inversion of a bit by the inverting means. This is useful for determining whether the error correction has been successful. However, it is not essential in situations where the occasional bad block is acceptable.

An apparatus according to the present invention may be conveniently employed in mobile phone.

According to the present invention, there is also provided a method of error-correcting a digital signal including a cyclic redundancy code, the apparatus comprising:
 receiving a data block including a CRC code;
 calculating the syndrome of the received data block;
 sequentially comparing the calculated syndrome with syndromes stored in a memory until a match is found or the stored syndromes have been exhausted and incrementing or decrementing a count for each comparison, the syndromes stored in the memory corresponding to respective ones of each of the possible single-bit error conditions of a received data block; and
 in the event of a match being found, inverting a bit of said received data block in dependence on the value of said count.

Preferably, syndromes stored in the memory are arranged in a list ordered by the error bit positions to which they relate.

The count may be initialised with a start address and the memory is addressed the value of the count, in which case the bit inverted is preferably determined by subtracting said start address from the current count value.

Alternatively, the memory may be addressed using the sum of a start address and the value of the count, in which case the bit inverted is preferably that in the position corresponding to the value of the count.

It will be appreciated that the mapping between the counter/count value and the bit to be inverted need not be direct and may involve adding and subtracting value or left and right shifts. Also, a look up table could be used for this and, whilst this would not be preferred, it would still represent a significant improvement in memory requirement over the prior art.

BRIELF DESCRIPTION OF THE DRAWINGS

DETAILED DESCRIPTION OF THE PREFERRED EMBODIMENTS

Preferred embodiments of the present invention will now be described, by way of example, with reference to the accompanying drawings.

Figure 1:
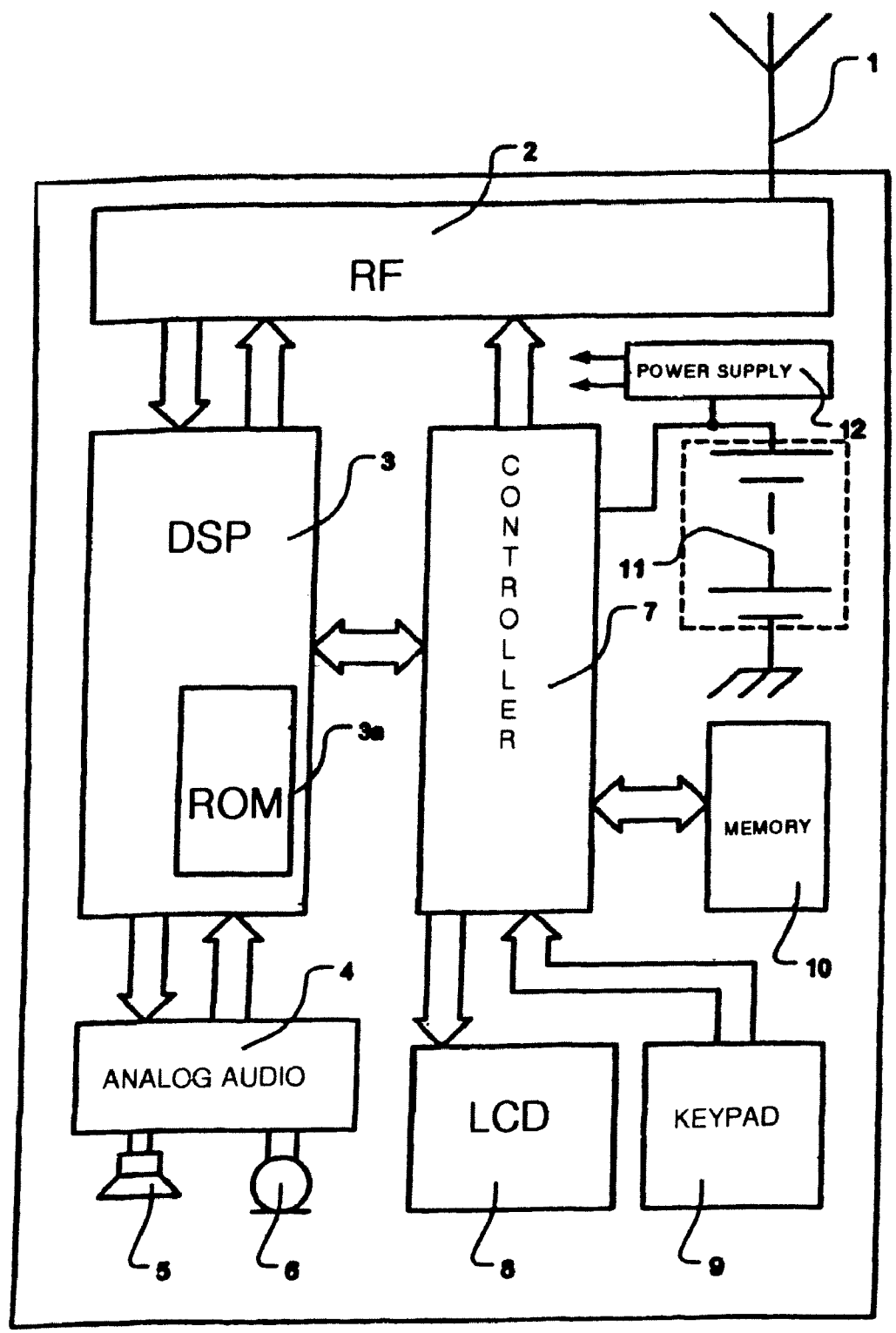
FIG. 1 is a block diagram of a mobile phone.

Referring to FIG. 1, a mobile telephone comprises an antenna 1, an rf subsystem 2, a baseband DSP (digital signal processing) subsystem 3, an analogue audio subsystem 4, a loudspeaker 5, a microphone 6, a controller 7, a liquid crystal display 8, a keypad 9, memory 10, a battery 11 and a power supply circuit 12.

The rf subsystem 2 contains if and rf circuits of the mobile telephone's transmitter and receiver and a frequency synthesizer for tuning the mobile telephone's transmitter and receiver. The antenna 1 is coupled to the rf subsystem 2 for the reception and transmission of radio waves.

The baseband DSP subsystem 3 is coupled to the rf subsystem 2 to receive baseband signals therefrom and for sending baseband modulation signals thereto.

The baseband DSP subsystems 3 includes codec functions which are well-known in the art.

The analogue audio subsystem 4 is coupled to the baseband DSP subsystem 3 and receives demodulated audio therefrom. The analogue audio subsystem 4 amplifies the demodulated audio and applies it to the loudspeaker 5. Acoustic signals, detected by the microphone 6, are pre-amplified by the analogue audio subsystem 4 and sent to the baseband DSP subsystem 4 for coding.

The controller 7 controls the operation of the mobile telephone. It is coupled to the rf subsystem 2 for supplying tuning instructions to the frequency synthesizer and to the baseband DSP subsystem 3 for supplying control data and management data for transmission. The controller 7 operates according to a program stored in the memory 10. The memory 10 is shown separately from the controller 7. However, it may be integrated with the controller 7. A timer for triggering interrupts is also provided by the controller 7.

The display device 8 is connected to the controller 7 for receiving control data and the keypad 9 is connected to the controller 7 for supplying user input data signals thereto.

The battery 11 is connected to the power supply circuit 12 which provides regulated power at the various voltages used by the components of the mobile telephone. The positive terminal of the battery 11 is connected to an analogue-to-digital converter (ADC) input of the controller 7.

The operation of the mobile telephone, insofar as it relates to the present invention, will now be described.

The baseband DSP subsystem 3 is programmed to decode received data signals encoded according to any of the four GPRS coding schemes CS1, CS2, CS3 and CS4. The decoding for coding schemes CS1, CS2 and CS3 is conventional and will not be described again here.

Figure 2:
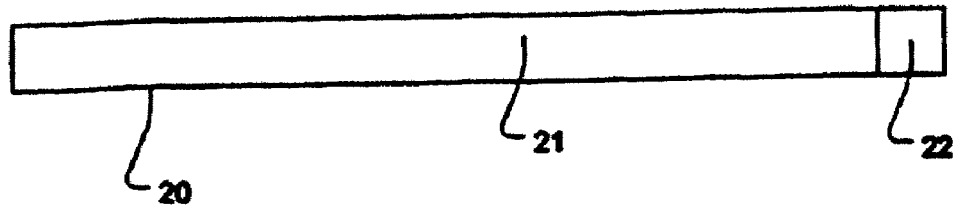
FIG. 2 illustrates a data block encoded using GPSR coding scheme CS4.

Referring to FIG. 2, each block 20 of a CS4 encoded signal comprises 431 data bits 21 and 16 CRC code bits 22.

At the transmitter, the data block is formed by calculating the CRC code bits 22 and appending these to the data bits 21.

The 16 CRC code bits (B(x)) are obtained using:

$$B(x) = \text{remainder of} \left[ \frac{M(x) \times 2^{16}}{G(x)} \right]$$

where the division is modulo-2 division, M(x) are the data bits and G(x) is the generator polynomial.

Thus, the transmitted data block 20 is $(M(x) \times 2^{16}) + B(x)$.

During transmission, the transmitted block 20 may become corrupted. That is, the received data block 20 is $((M(x) \times 2^{16}) + B(x)) + N(x)$, where "+" is bitwise modulo-2 addition. If N(x) is a value in the set $2^n$ where n is an integer in the range 0 to 446 only one bit, i.e. bits 0 to 446 respectively, of the data block 20 will be affected.

A feature of CRC code generation is that for single-bit errors there is a one-to-one relationship between error bit position and syndrome value. The following relationship exists between error bit positions and syndromes in the case where there are 447 data and CRC bits and G(x)=18938, i.e. 1 0001 0000 0010 0001 in binary notation.

| Error Bit. | Syndrome |
|---|---|
| 0 | 19781 |
| 1 | 44722 |
| 2 | 22361 |
| 3 | 41916 |
| 4 | 20958 |
| 5 | 10479 |
| 6 | 40039 |
| 7 | 50723 |
| 8 | 60161 |
| 9 | 64912 |
| 10 | 32456 |
| 11 | 16228 |
| 12 | 8114 |
| 13 | 4057 |
| 14 | 36860 |
| 15 | 18430 |
| 16 | 9215 |
| 17 | 39407 |
| 18 | 50407 |
| 19 | 60003 |
| 20 | 64801 |
| 21 | 63104 |
| 22 | 31552 |
| 23 | 15776 |
| 24 | 7888 |
| 25 | 3944 |
| 26 | 1972 |
| 27 | 986 |
| 28 | 493 |
| 29 | 35046 |
| 30 | 17523 |
| 31 | 43561 |
| 32 | 56580 |
| 33 | 28290 |
| 34 | 14145 |
| 35 | 37808 |
| 36 | 18904 |
| 37 | 9452 |
| 38 | 4726 |
| 39 | 2363 |
| 40 | 35981 |
| 41 | 52822 |
| 42 | 26411 |
| 43 | 48005 |
| 44 | 54738 |
| 45 | 27369 |
| 46 | 48484 |
| 47 | 24242 |
| 48 | 12121 |
| 49 | 40892 |
| 50 | 20446 |
| 51 | 10223 |
| 52 | 39911 |
| 53 | 50659 |
| 54 | 60129 |
| 55 | 64864 |
| 56 | 32432 |

-continued

| Error Bit. | Syndrome |
|---|---|
| 57 | 16216 |
| 58 | 8108 |
| 59 | 4054 |
| 60 | 2027 |
| 61 | 35813 |
| 62 | 52706 |
| 63 | 26353 |
| 64 | 47976 |
| 65 | 23988 |
| 66 | 11994 |
| 67 | 5997 |
| 68 | 33702 |
| 69 | 16851 |
| 70 | 43257 |
| 71 | 56428 |
| 72 | 28214 |
| 73 | 14107 |
| 74 | 37789 |
| 75 | 49630 |
| 76 | 24815 |
| 77 | 47207 |
| 78 | 54307 |
| 79 | 57857 |
| 80 | 63760 |
| 81 | 31880 |
| 82 | 15940 |
| 83 | 7970 |
| 84 | 3985 |
| 85 | 36824 |
| 86 | 18412 |
| 87 | 9206 |
| 88 | 4603 |
| 89 | 33005 |
| 90 | 51302 |
| 91 | 25651 |
| 92 | 47625 |
| 93 | 54548 |
| 94 | 27274 |
| 95 | 13637 |
| 96 | 37554 |
| 97 | 18777 |
| 98 | 44220 |
| 99 | 22110 |
| 100 | 11055 |
| 101 | 40327 |
| 102 | 50899 |
| 103 | 60281 |
| 104 | 64940 |
| 105 | 32470 |
| 106 | 16235 |
| 107 | 38821 |
| 108 | 50114 |
| 109 | 25057 |
| 110 | 47328 |
| 111 | 23664 |
| 112 | 11832 |
| 113 | 5916 |
| 114 | 2958 |
| 115 | 1479 |
| 116 | 35571 |
| 117 | 52585 |
| 118 | 61092 |
| 119 | 30546 |
| 120 | 15273 |
| 121 | 38340 |
| 122 | 19170 |
| 123 | 9585 |
| 124 | 39592 |
| 125 | 19796 |
| 126 | 9898 |
| 127 | 4949 |
| 128 | 33210 |
| 129 | 16605 |
| 130 | 43134 |
| 131 | 21567 |
| 132 | 41487 |

-continued

| Error Bit. | Syndrome |
|---|---|
| 133 | 55575 |
| 134 | 58523 |
| 135 | 64093 |
| 136 | 62782 |
| 137 | 31391 |
| 138 | 46431 |
| 139 | 53951 |
| 140 | 57679 |
| 141 | 63671 |
| 142 | 62539 |
| 143 | 62005 |
| 144 | 61706 |
| 145 | 30853 |
| 146 | 46162 |
| 147 | 23081 |
| 148 | 42244 |
| 149 | 21122 |
| 150 | 10561 |
| 151 | 40112 |
| 152 | 20056 |
| 153 | 10028 |
| 154 | 5014 |
| 155 | 2507 |
| 156 | 36085 |
| 157 | 52842 |
| 158 | 26421 |
| 159 | 48010 |
| 160 | 24005 |
| 161 | 42738 |
| 162 | 21369 |
| 163 | 41388 |
| 164 | 20694 |
| 165 | 10347 |
| 166 | 39973 |
| 167 | 50690 |
| 168 | 25345 |
| 169 | 47504 |
| 170 | 23752 |
| 171 | 11876 |
| 172 | 5938 |
| 173 | 2969 |
| 174 | 36316 |
| 175 | 18158 |
| 176 | 9079 |
| 177 | 39339 |
| 178 | 50373 |
| 179 | 60018 |
| 180 | 30009 |
| 181 | 45708 |
| 182 | 22854 |
| 183 | 11427 |
| 184 | 40513 |
| 185 | 50992 |
| 186 | 25496 |
| 187 | 12748 |
| 188 | 6374 |
| 189 | 3187 |
| 190 | 36393 |
| 191 | 52996 |
| 192 | 26498 |
| 193 | 13249 |
| 194 | 37360 |
| 195 | 18680 |
| 196 | 9340 |
| 197 | 4670 |
| 198 | 2335 |
| 199 | 35999 |
| 200 | 52831 |
| 201 | 61247 |
| 202 | 65423 |
| 203 | 63447 |
| 204 | 62459 |
| 205 | 61933 |
| 206 | 61670 |
| 207 | 30835 |
| 208 | 46121 |

-continued

| Error Bit. | Syndrome |
|---|---|
| 209 | 53764 |
| 210 | 26882 |
| 211 | 13441 |
| 212 | 37456 |
| 213 | 18728 |
| 214 | 9364 |
| 215 | 4682 |
| 216 | 2341 |
| 217 | 35970 |
| 218 | 17985 |
| 219 | 43824 |
| 220 | 21912 |
| 221 | 10956 |
| 222 | 5478 |
| 223 | 2739 |
| 224 | 36169 |
| 225 | 52916 |
| 226 | 26458 |
| 227 | 13229 |
| 228 | 37318 |
| 229 | 18659 |
| 230 | 44129 |
| 231 | 56864 |
| 232 | 28432 |
| 233 | 14216 |
| 234 | 7108 |
| 235 | 3554 |
| 236 | 1777 |
| 237 | 35688 |
| 238 | 17844 |
| 239 | 8922 |
| 240 | 4461 |
| 241 | 32934 |
| 242 | 16467 |
| 243 | 43065 |
| 244 | 56332 |
| 245 | 28166 |
| 246 | 14083 |
| 247 | 37777 |
| 248 | 49624 |
| 249 | 24812 |
| 250 | 12406 |
| 251 | 6203 |
| 252 | 33805 |
| 253 | 51734 |
| 254 | 25867 |
| 255 | 47765 |
| 256 | 54618 |
| 257 | 27309 |
| 258 | 48454 |
| 259 | 24227 |
| 260 | 42817 |
| 261 | 56240 |
| 262 | 28120 |
| 263 | 14060 |
| 264 | 7030 |
| 265 | 3515 |
| 266 | 36557 |
| 267 | 53110 |
| 268 | 26555 |
| 269 | 48077 |
| 270 | 54774 |
| 271 | 27387 |
| 272 | 48493 |
| 273 | 54950 |
| 274 | 27475 |
| 275 | 48569 |
| 276 | 54988 |
| 277 | 27494 |
| 278 | 13747 |
| 279 | 37577 |
| 280 | 49524 |
| 281 | 24762 |
| 282 | 12381 |
| 283 | 36926 |
| 284 | 18463 |

-continued

| Error Bit. | Syndrome |
|---|---|
| 285 | 44063 |
| 286 | 56863 |
| 287 | 59167 |
| 288 | 64415 |
| 289 | 62943 |
| 290 | 62207 |
| 291 | 61807 |
| 292 | 61607 |
| 293 | 61507 |
| 294 | 61489 |
| 295 | 61448 |
| 296 | 30724 |
| 297 | 15362 |
| 298 | 7681 |
| 299 | 34576 |
| 300 | 17288 |
| 301 | 8644 |
| 302 | 4322 |
| 303 | 2161 |
| 304 | 35880 |
| 305 | 17940 |
| 306 | 8970 |
| 307 | 4485 |
| 308 | 32978 |
| 309 | 16489 |
| 310 | 43044 |
| 311 | 21522 |
| 312 | 10761 |
| 313 | 40212 |
| 314 | 20106 |
| 315 | 10053 |
| 316 | 39858 |
| 317 | 19929 |
| 318 | 44796 |
| 319 | 22398 |
| 320 | 11199 |
| 321 | 40399 |
| 322 | 50935 |
| 323 | 60267 |
| 324 | 64933 |
| 325 | 63170 |
| 326 | 31585 |
| 327 | 46496 |
| 328 | 23248 |
| 329 | 11624 |
| 330 | 5812 |
| 331 | 2906 |
| 332 | 1453 |
| 333 | 35526 |
| 334 | 17763 |
| 335 | 43681 |
| 336 | 56640 |
| 337 | 28320 |
| 338 | 14160 |
| 339 | 7080 |
| 340 | 3540 |
| 341 | 1770 |
| 342 | 885 |
| 343 | 35242 |
| 344 | 17621 |
| 345 | 43642 |
| 346 | 21821 |
| 347 | 41614 |
| 348 | 20807 |
| 349 | 41139 |
| 350 | 55369 |
| 351 | 58420 |
| 352 | 29210 |
| 353 | 14605 |
| 354 | 38038 |
| 355 | 19019 |
| 356 | 44341 |
| 357 | 56970 |
| 358 | 28485 |
| 359 | 49074 |
| 360 | 24537 |

-continued

| Error Bit. | Syndrome |
| --- | --- |
| 361 | 43004 |
| 362 | 21502 |
| 363 | 10751 |
| 364 | 40175 |
| 365 | 50791 |
| 366 | 60195 |
| 367 | 64897 |
| 368 | 63184 |
| 369 | 31592 |
| 370 | 15796 |
| 371 | 7898 |
| 372 | 3949 |
| 373 | 36774 |
| 374 | 18387 |
| 375 | 44025 |
| 376 | 56812 |
| 377 | 28406 |
| 378 | 14203 |
| 379 | 37805 |
| 380 | 49606 |
| 381 | 24803 |
| 382 | 47201 |
| 383 | 54304 |
| 384 | 27152 |
| 385 | 13576 |
| 386 | 6788 |
| 387 | 3394 |
| 388 | 1697 |
| 389 | 35648 |
| 390 | 17824 |
| 391 | 8912 |
| 392 | 4456 |
| 393 | 2228 |
| 394 | 1114 |
| 395 | 557 |
| 396 | 35078 |
| 397 | 17539 |
| 398 | 43601 |
| 399 | 56632 |
| 400 | 28316 |
| 401 | 14158 |
| 402 | 7079 |
| 403 | 34243 |
| 404 | 51953 |
| 405 | 60776 |
| 406 | 30388 |
| 407 | 15194 |
| 408 | 7597 |
| 409 | 34502 |
| 410 | 17251 |
| 411 | 43425 |
| 412 | 56512 |
| 413 | 28256 |
| 414 | 14128 |
| 415 | 7064 |
| 416 | 3532 |
| 417 | 1766 |
| 418 | 883 |
| 419 | 35241 |
| 420 | 52420 |
| 421 | 26210 |
| 422 | 13105 |
| 423 | 37256 |
| 424 | 18628 |
| 425 | 9314 |
| 426 | 4657 |
| 427 | 33032 |
| 428 | 16516 |
| 429 | 8258 |
| 430 | 4129 |
| 431 | 32768 |
| 432 | 16384 |
| 433 | 8192 |
| 434 | 4096 |
| 435 | 2048 |
| 436 | 1024 |

-continued

| Error Bit. | Syndrome |
| --- | --- |
| 437 | 512 |
| 438 | 256 |
| 439 | 128 |
| 440 | 64 |
| 441 | 32 |
| 442 | 16 |
| 443 | 8 |
| 444 | 4 |
| 445 | 2 |
| 446 | 1 |

The same relationship is always obtained with the aforementioned value of G(x) when applied to a 447 bit data block, irrespective of the actual states of the bits of the data block. It can also be seen that no syndromes are repeated.

Referring again to FIG. 1, the baseband DSP subsystem 3 is provided with an area of ROM 3a pre-programmed with the above ordered list of syndromes. The syndromes for single-bit errors are stored at respective locations defined by b+n, where b is a start address and n is the error bit position. The list of syndrome requires only 447 words in the ROM 3a.

Figure 3:
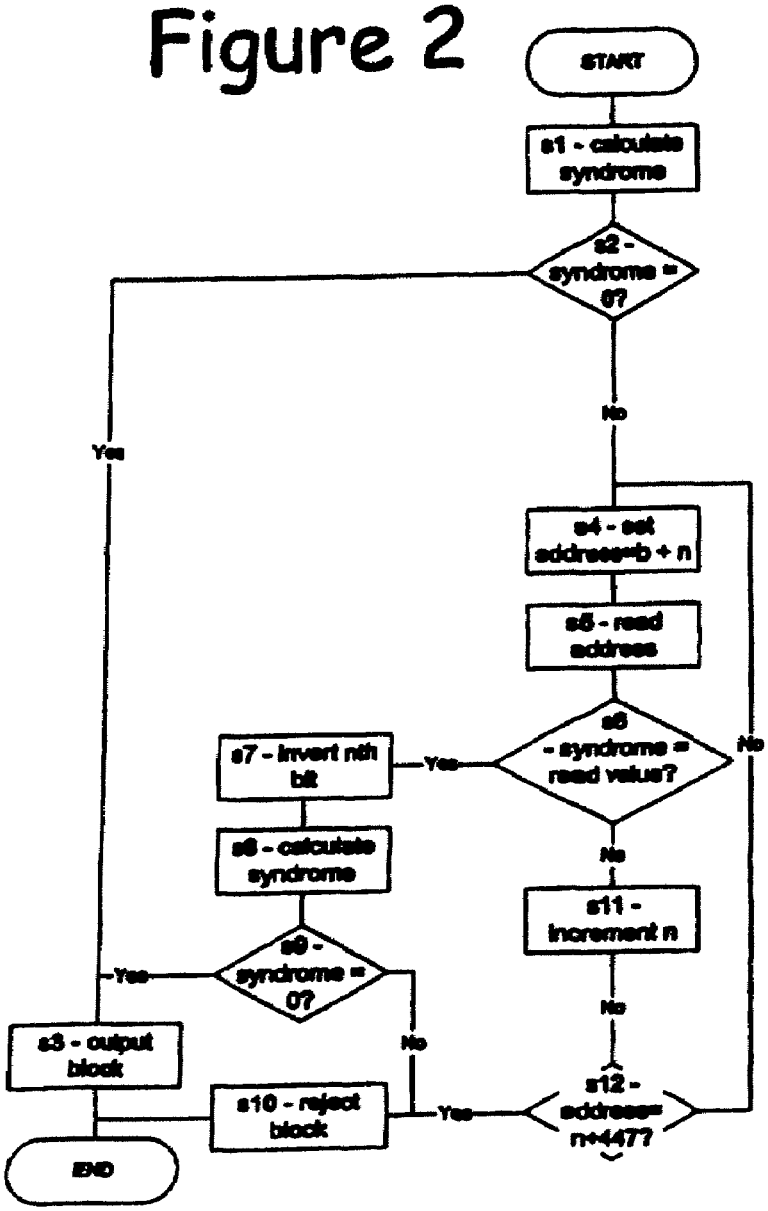
FIG. 3 is a flowchart illustrating error correction according to the present invention.

Referring to FIG. 3, when a CS4 encoded block is received by the baseband DSP subsystem, the baseband DSP subsystem 3 first calculates the block's syndrome (step s1). It then determines whether the syndrome is 0, indicating an uncorrupted block (step s2). If the block is uncorrupted, it is output for further processing (step s3).

If the block is corrupted, an address counter is set to b+n with n equals 0 initially (step s4). The value in the ROM 3a at the location addressed by the address counter value is then read (step s5). The returned value is compared with the syndrome calculated in step s1 (step 6). If the values match, the nth bit of the received block is inverted (step s7). The value of n is obtained by subtracting b from the current address. The syndrome for the modified block is then calculated (step s8). If the newly calculated syndrome is 0 (step s9), the modified block is output (step 3). However, if the newly calculated syndrome is not 0 (step s9), the block is rejected (step s10).

If there is not a match at step s6, the counter value n is incremented (step s11) and it is then determined whether the address equals b+447, i.e. all of the ROM locations containing syndromes have been read, (step s12). If all of the addresses have been read, the block is rejected (step s10), otherwise the process returns to step s4.

Simulations show that if the BLER for CS4 encoding is 10%, approximately 40% of all rejected blocks contain only one bit error. Consequently, the above process increases system performance considerably.

In an alternative embodiments, the ROM addresses are calculated by incrementing an address counter value in each iteration. In this case, the error bit position can be obtained by subtracting the start address from the current counter value.

It will be appreciated that inverse logic could be used, in which case a syndrome of value 0 would be represented by 1111111111111111.

It will be appreciated that the present invention can be used in systems other than mobile phones and is applicable generally to communication systems, data recording and playback systems and the like.

The invention claimed is:

1. An apparatus for error-correcting a digital signal including a cyclic redundancy code (CRC), the apparatus comprising:

a memory storing CRC syndromes, the syndromes corresponding to respective ones of each of the possible single-bit error conditions of a received signal;

a comparator configured to sequentially compare a CRC syndrome for a received signal with syndromes in said memory;

a counter configured to be incremented or decremented for each comparison by the comparator until a match is found or the CRC syndromes stored in the memory have been exhausted; and an inverter for inverting a bit of said received signal in dependence on a value of said counter, wherein the CRC code is provided as the modulo-2 quotient of data bits and a generator polynomial providing that for single-bit errors there is a one-to-one relationship between error bit position and syndrome value, said quotient being given by the mathematical expression:

$$B(x) = \text{remainder of } [M(x) \times 2^k / G(x)]$$

wherein the division is modulo-2 division, M(x) are the data bits, G(x) is the generator polynomial, k is the number of CRC code bits, and a transmitted data block is given by:

$$(M(x) \times 2^k) + B(x).$$

2. An apparatus according to claim 1, wherein the syndromes stored in the memory are arranged in a list ordered by the error bit positions to which they relate.

3. An apparatus according to claim 2, wherein the counter is initialised with a start address and the comparator is configured to address the memory using the value of the counter.

4. An apparatus according to claim 3, wherein the inverter is configured to subtract said start address from the counter value to determine the bit to be inverted.

5. An apparatus according to claim 2, wherein the comparator is configured to address the memory using an address value generated by adding a start address value to the value of the counter.

6. An apparatus according to claims 5, wherein the inverter is configured to invert the bit in the position corresponding to the value of said counter.

7. An apparatus according to claim 1, including a processor for calculating the syndrome of the block after inversion of a bit by the inverting means.

8. A mobile phone including an apparatus according to claim 1.

9. A method of error-correcting a digital signal including a cyclic redundancy code, comprising:

receiving a data block including a CRC code;

calculating the syndrome of the received data block;

sequentially comparing the calculated syndrome with syndromes stored in a memory until a match is found or the stored syndromes have been exhausted and incrementing or decrementing a count for each comparison, the syndromes stored in the memory corresponding to respective ones of each of the possible single-bit error conditions of a received data block; and in the event of a match being found, inverting a bit of said received data block in dependence on a value of said count, wherein the CRC code is provided as the modulo-2 quotient of data bits and a generator polynomial providing that for single-bit errors there is a one-to-one relationship between error bit position and syndrome value, said quotient being given by the mathematical expression:

$$B(x) = \text{remainder of } [M(x) \times 2^k / G(x)]$$

wherein the division is modulo-2 division, M(x) are the data bits, G(x) is the generator polynomial, k is the number of CRC code bits, and a transmitted data block is given by:

$$(M(x) \times 2^k) + B(x).$$

10. A method according to claim 9, wherein the syndromes stored in the memory are arranged in a list ordered by the error bit positions to which they relate.

11. A method according to claim 10, wherein the count is initialised with a start address and the memory is addressed using the value of the count.

12. A method according to claim 11, wherein the bit inverted is determined by subtracting said start address from the count value.

13. A method according to claim 10, wherein the memory is addressed using the sum of a start address and the value of the count.

14. A method according to claim 13, wherein the bit inverted is that in the position corresponding to the value of the count.

15. A computer-readable storage medium containing a computer program which, upon execution by a computer, directs the computer to perform the functions of:

correcting a digital signal including a cyclic redundancy code, the digital signal having a data block including a CRC code;

calculating the syndrome of the data block;

sequentially comparing the calculated syndrome with syndromes stored in a memory until a match is found or the stored syndromes have been exhausted and incrementing or decrementing a count for each comparison, the syndromes stored in the memory corresponding to respective ones of each of the possible single-bit error conditions of a received data block; and in the event of a match being found, inverting a bit of said data block in dependence on a value of said count, wherein the CRC code is provided as the modulo-2 quotient of data bits and a generator polynomial providing that for single-bit errors there is a one-to-one relationship between error bit position and syndrome value, said quotient being given by the mathematical expression:

$$B(x) = \text{remainder of } [M(x) \times 2^k / G(x)]$$

wherein the division is modulo-2 division, M(x) are the data bits, G(x) is the generator polynomial, k is the number of CRC code bits, and a transmitted data block is given by:

$$(M(x) \times 2^k) + B(x).$$

16. A computer-readable storage medium containing a computer program according to claim 15, wherein the syndromes stored in the memory are arranged in a list ordered by the error bit positions to which they relate.

17. A computer-readable storage medium containing a computer program according to claim 16, wherein the count is initialised with a start address and the memory is addressed using the value of the count.

18. A computer-readable storage medium containing a computer program according to claim 17, wherein the bit inverted is determined by subtracting said start address from the count value.

* * * * *

UNITED STATES PATENT AND TRADEMARK OFFICE
CERTIFICATE OF CORRECTION

| | |
|---|---|
| PATENT NO. | : 7,496,825 B2 |
| APPLICATION NO. | : 10/515809 |
| DATED | : February 24, 2009 |
| INVENTOR(S) | : Niels Degn |

Page 1 of 1

It is certified that error appears in the above-identified patent and that said Letters Patent is hereby corrected as shown below:

In column 1, line 1, Title page, item [75] inventor: Address delete "Fredriksberg" and insert --Lynge--, therefore.

Signed and Sealed this

Twenty-eighth Day of July, 2009

JOHN DOLL
*Acting Director of the United States Patent and Trademark Office*